US006315397B2

(12) United States Patent
Truninger et al.

(10) Patent No.: US 6,315,397 B2
(45) Date of Patent: Nov. 13, 2001

(54) IN-SITU FLUID JET ORIFICE

(75) Inventors: Martha Truninger, Corvallis; Phillip R. Coffman, Woodburn; Charles C. Haluzak, Corvallis; John P. Whitlock, Lebanon, all of OR (US); Douglas A. Sexton, San Diego, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/736,653

(22) Filed: Dec. 13, 2000

Related U.S. Application Data

(63) Continuation of application No. 09/033,487, filed on Mar. 2, 1998.

(51) Int. Cl.[7] .............................. B41J 2/05; H01L 21/461

(52) U.S. Cl. .............................................. 347/63; 438/691

(58) Field of Search ................................. 347/63, 56, 54, 347/71, 47; 216/48, 4; 29/890.1; 430/311; 438/690, 691, 710, 723, 724, 735, 706, 745, 689

(56) References Cited

U.S. PATENT DOCUMENTS 4,676,869 6/1987 Lee et al. .

*Primary Examiner*—Raquel Yvette Gordon
(74) *Attorney, Agent, or Firm*—Timothy F. Myers

(57) ABSTRACT

A process for creating and an apparatus employing reentrant (pointing or directed inward) shaped orifices in a semiconductor substrate. A layer of graded dielectric material is deposited on the semiconductor substrate. A masked photoimagable material is deposited upon the graded dielectric material and exposed to electromagnetic energy such that a patterned photoimagable material is created. The patterned photoimagable material is developed to unveil the graded dielectric material which is then anisotropically etched. The bore in the graded dielectric material is then isotropically etched to complete the creation of holes in the substrate.

10 Claims, 11 Drawing Sheets

IN-SITU FLUID JET ORIFICE

This is a continuation of copending application Ser. No. 09/033,487, filed on Mar. 2, 1998.

BACKGROUND OF THE INVENTION

This invention generally relates to thermal inkjet printing. More particularly, this invention relates to the apparatus and process of manufacturing precise orifices using a graded dielectric material using anisotropic etching and followed by isotropic etching of the graded dielectric material.

Thermal inkjet printers typically have a printhead mounted on a carriage that traverses back and forth across the width of the paper or other medium feeding through the printer. The printhead includes an array of orifices (also called nozzles) which face the paper. Associated with each orifice is a firing chamber. Ink (or another fluid) filled channels feed the firing chamber with ink from a reservoir ink source. Applied individually to addressable resistors, energy heats the ink within the firing chambers causing the ink to bubble and thus expel ink out of the orifice toward the paper. Those skilled in the art will appreciate that other methods of transferring energy to the ink or fluid exist and still fall within the spirit, scope and principle of the present invention. As the ink is expelled, the bubble collapses and more ink fills the channels and firing chambers from the reservoir, allowing for repetition of the ink expulsion.

Current designs of inkjet printheads have problems in their manufacturing, operating life and accuracy in directing the ink onto the paper. Printheads currently produced comprise an inkfeed slot, a barrier interface (The barrier interface channels the ink to the resistor and defines the firing chamber volume. The barrier material is a thick, photosensitive material that is laminated onto the wafer, exposed, developed, and cured), and an orifice plate (The orifice plate is the exit path of the firing chamber. The orifice is typically electroformed with nickel (Ni) and then coated with gold (Au), palladium, or other precious metals for corrosion resistance. The thickness and bore diameter of the orifice plate are controlled to allow repeatable drop ejection when firing.). During manufacturing, aligning the orifice plate requires special precision and special adhesives to attach it to other portions of the printhead. If the orifice plate is warped or if the adhesive does not correctly bond the orifice plate to the barrier interface, poor control of the ink results and the yield or life of the printhead is reduced. If the alignment of the printhead is incorrect or the orifice plate is dimpled (non-uniform in its planarization), the ink will be ejected away from its proper trajectory and the image quality of the printout is reduced. Because the orifice plate is a separate piece, the thickness required to prevent warping or buckling during manufacturing requires the height (related to thickness of the orifice plate) of the orifice bore to be higher than necessary for thermal efficiency. The increased height of the ink in the orifice bore, from the resistor to the orifice plate's outer surface, requires more heating to eject the ink. A related issue is that reproductions that are more accurate require higher resolutions of ink placement onto the medium. Therefore, the amount of ink expelled must be reduced to create a finer dot on the medium. As the quantity of ink expelled becomes smaller, more orifices are required within the printhead to create a given pattern in a single traverse of the printhead over the medium at a fixed print speed. In the past, the lifetime of the printhead was adequate as the printhead was part of a disposable pen that was replaced after the ink supply ran out. User expectations for quality are driving the need to have a long life printhead with multiyear permanence and the present invention helps fulfill this expectation.

SUMMARY OF THE INVENTION

A process for creating and an apparatus employing reentrant shaped orifices in a semiconductor substrate. A layer of graded dielectric material is deposited on the semiconductor substrate. A photoimagable material is applied upon the graded dielectric material, masked and exposed to electromagnetic energy such that a patterned photoimagable material is created. The patterned photoimagable material is developed to unveil the graded dielectric material, which is then anisotropically etched. The graded dielectric material is then isotropically etched to complete the creation of reentrant holes in the substrate.

BRIEF DESCRIPTION OF THE DRAWINGS

FIG. 7A shows a cross section of a silicon substrate that has been processed by depositing two separate dielectric layers having different etch characteristics for an anisotropic etch process. A photoresist layer is deposited upon the last dielectric layer and shows the orifice pattern opening.

FIG. 7B shows a cross section of the silicon substrate from FIG. 7A after it has been anisotropically etched.

FIG. 7D shows a cross section of the silicon substrate from FIG. 7B or FIG. 7C after it has been isotropically etched.

DETAILED DESCRIPTION OF THE PREFERRED AND ALTERNATE EMBODIMENTS

Figure 1A:
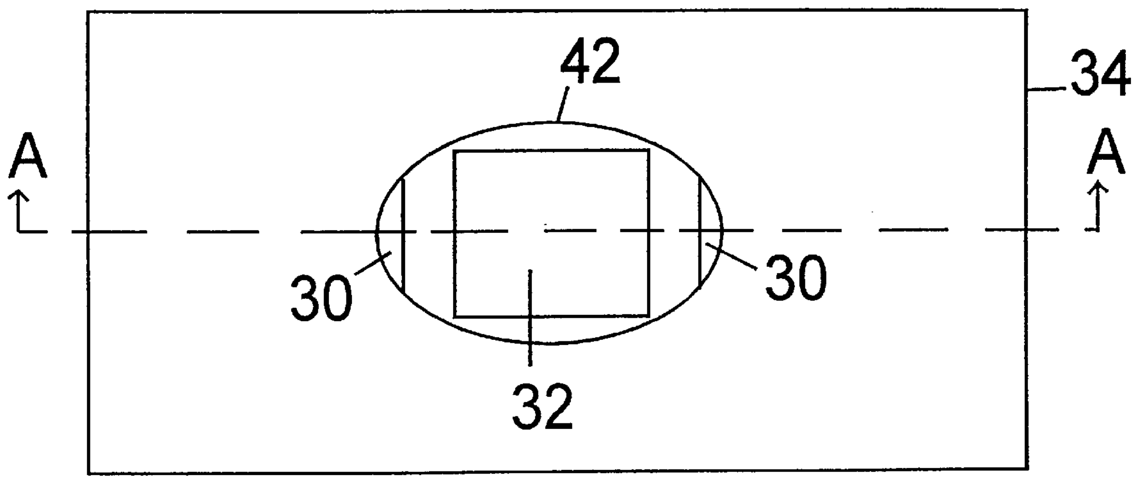
FIG. 1A shows the top view of a single orifice of the preferred embodiment.

FIG. 1A shows the top view of a single orifice (also called a nozzle or a hole) using a preferred embodiment of the present invention. Graded dielectric layer 34 (A layer arranged in a graduated series or a layer progressively graded, the grade being representative of the material composition of the layer or the material stress within the layer) has an opening defined therein constituting reentrant (pointing or directed inwards) orifice 42. A fluid, such as ink, in drawn into the reentrant orifice 42 through fluid feed slots 30. The fluid is heated using energy dissipation element 32, which can be a resistor, a piezoelectric device, or an electrorestrictive device among other propulsive mechanisms. For a resistor, heating the fluid forms a bubble and the force from the bubble propels the liquid adjacent to the bubble out of reentrant orifice 42, thereby forming a liquid jet of fluid.

Figure 1B:
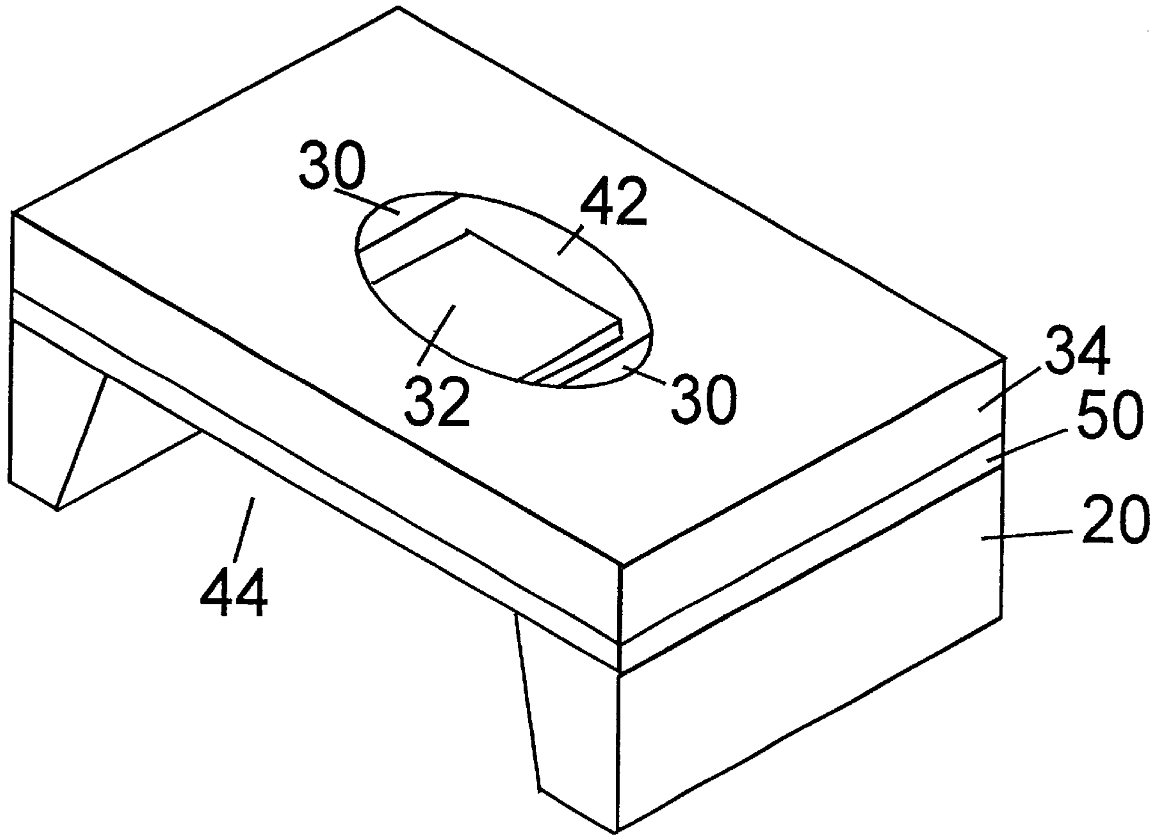
FIG. 1B is a isometric cross sectional view of the orifice showing the basic structure.

FIG. 1B is an isometric view of the reentrant orifice 42 showing the basic erect structure. Fluid is conducted through fluid feed channel 44 along the backside of semiconductor substrate 20 and brought into the reentrant orifice 42 through fluid feed slots 30. A stack of thin film layers 50 is used to define circuitry that is used to control the flow of fluid from reentrant orifice 42, such as energy dissipation element 32. A graded dielectric layer 34 is deposited on top of the stack of thin film layers 50 and etched to form reentrant orifice 42.

Figure 2A:
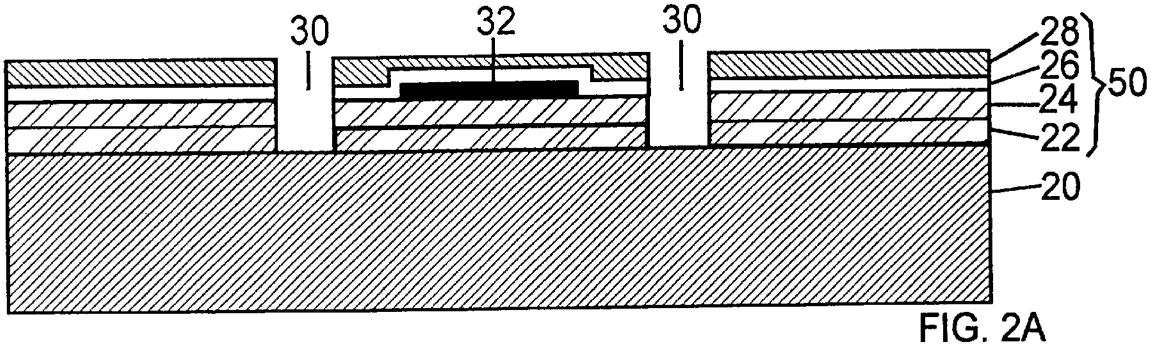
FIGS. 2A through 2F show the process steps in a alternate embodiment to create an in-situ orifice. The cut-away view is the 11 perspective from FIG. 1A.

FIG. 2A shows a semiconductor substrate 20 that has been processed to deposit the stack of thin film layers 50. This stack, for a resistive fluid jet printhead would be composed of a layer of $SiO_2$ (silicon dioxide) 22, a layer of PSG (phosphosilicate glass) 24, a layer TaAl (Tantalum Aluminum) used to form the energy dissipation element 32, a layer of Al for interconnection (not shown), a layer of dielectrics 26 comprised of $Si_3N_4$ (silicon nitride) and SiC (silicon carbide) and a layer of Ta (Tantalum) 28 used to protect the previous layers from the corrosive effects of the fluid. Those skilled in the art will appreciate that other thin film layer stacks can be used and still fall within the spirit and scope of the invention. After the stack of thin film layers 50 is placed on semiconductor substrate 20, fluid feed slots 30 are etched in the stack of thin film layers 50.

Figure 2B:
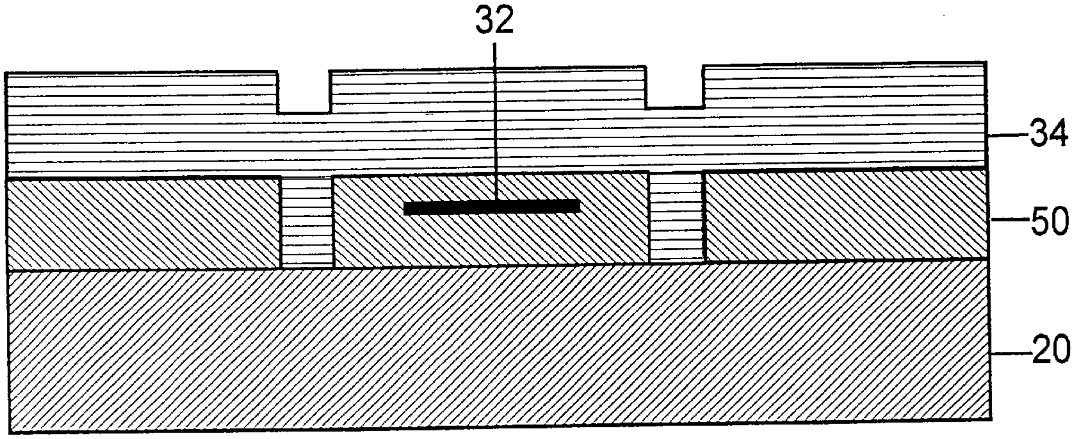

FIG. 2B shows the result of the conformal deposition (not to scale) of graded dielectric material 34. After graded dielectric material 34 is deposited, a planarization process is used to even out the top surface of graded dielectric material 34. This planarization can be achieved, for example, using CMP (Chemical Mechanical Planarization), a planarization etch, or preferably a SOG (Spin on Glass) technique. Several embodiments for performing the gradation of the dielectric material exist. The graded dielectric material 34 layer is comprised of a gradation of a composition of matter or of a gradation of stress. The layer is comprised of a continuous gradation or the gradation may occur in steps through the buildup of several thin layers. A first alternate embodiment in which gradation is achieved by using silicon oxynitride material $SiO_xN_y$ where the amount of oxygen (x) or nitrogen (y) vary depending on the amounts present during deposition of the layer. A second alternate embodiment of gradation is to have the amount of nitrogen remain fixed while varying the amount of oxygen. An example would be to have the concentration of oxygen present decrease as the stack builds up. In a third alternate embodiment, the amount of oxygen could remain fixed while the amount of nitrogen varied. A thickness of 8 microns or more, preferably 8 to 30 microns, of graded silicon oxynitride is deposited using preferably a SOG technique (such as a solution based spin coating tool) or using single or dual frequency PECVD (Plasma Enhanced Chemical Vapor Deposition), APCVD (Atmospheric Pressure Chemical Vapor Deposition) or a high-density deposition tool. However, if the amount of oxygen or nitrogen cannot be variably controlled during deposition, the 8 to 30 microns of graded silicon oxynitride can be done using several thinner layers, for example 2 to 6 microns, in which each thinner layer has a fixed ratio of oxygen to nitrogen but each thinner layer has a different composition than the other layers. Again, the amount of oxygen to nitrogen ratio can be increased or decreased in each successive thinner layer.

In a fourth alternate embodiment, the composition of matter gradation can be done using variable doping of silicon dioxide as it is deposited using elemental dopants or a variety of network modifiers or formers. Possible elemental dopants are boron, preferably phosphorous, arsenic, germanium or fluorine. In an exemplary embodiment of the invention using phosphorous doped oxide, the percent concentration of phosphorous in the material is varied through the graded dielectric material 34. The greatest percentage of phosphorous would exist in the bottom of the graded dielectric material 34 with little or no phosphorous in the top.

Network modifiers or network formers, as an alternative to elemental doping, can be added to the silicon dioxide to either enhance or decrease etch rates as desired. Network modifiers such as $Na_2O$ and NaCl donate the anion to the $SiO_2$ network and depolymerize it. This effect decreases density and increases the etch rate. The cation is mobile in the open channels formed by the depolymerization. A network former such as $P_2O_5$ (phosphorous pentoxide) is locked into the oxide structure and it donates some of its oxygen to the $SiO_2$, thereby depolymerizing it and increasing the etch rate. Another network former is $B_2O_3$ (boric oxide) and it bonds to the non-bridging oxygen in the $SiO_2$ which polymerizes it and decreases the etch rate.

A fifth alternate embodiment of the invention grades the dielectric material by using iterative layers comprising different levels of stress within each layer. For oxide materials, the stress within the material, the optical refractive index of the material, the composition, and density of the material are inter-related. By holding one of the variables constant, the changes to the others will be interrelated. An 8 to 30 micron graded dielectric material 34 is made up of several thinner layers in which each thin layer has substantially the same optical refractive index. Stress in each of the thin layers is then individually altered by varying the hydrogen content of the material, thus varying the material density within each thin layer. By increasing or decreasing plasma power in a PECVD process, the stress can be varied as desired. Possible material deposited to form the layers are PECVD TEOS (tetraethylorthosilcate)-derived silicon dioxide, silane-based silicon dioxide, or preferably silicon oxynitride using a single or dual frequency deposition tool may be used with acceptable results. The stress is graded such that the most tensile layer is at the bottom (near the semiconductor substrate) and the most compressive layer is at the top of the graded dielectric material 34. The appropriate isotropic etch process and anisotropic etch process compatible with the dielectric material chosen would then be performed to create the reentrant orifice. The essential distinction in this stress related embodiment being that material with less compressive stress is etched at a faster rate than material with a higher compressive stress and thus forming the reentrant profile of the orifice.

Finally, a sixth alternate embodiment of the invention uses both composition of matter and stress gradation, combined, to optimize the material thickness and to enhance etch rates which produce the optimum reentrant orifice bore profile. Special structures such as serrated reentrant bore profiles are achieved using this method.

Figure 2C:
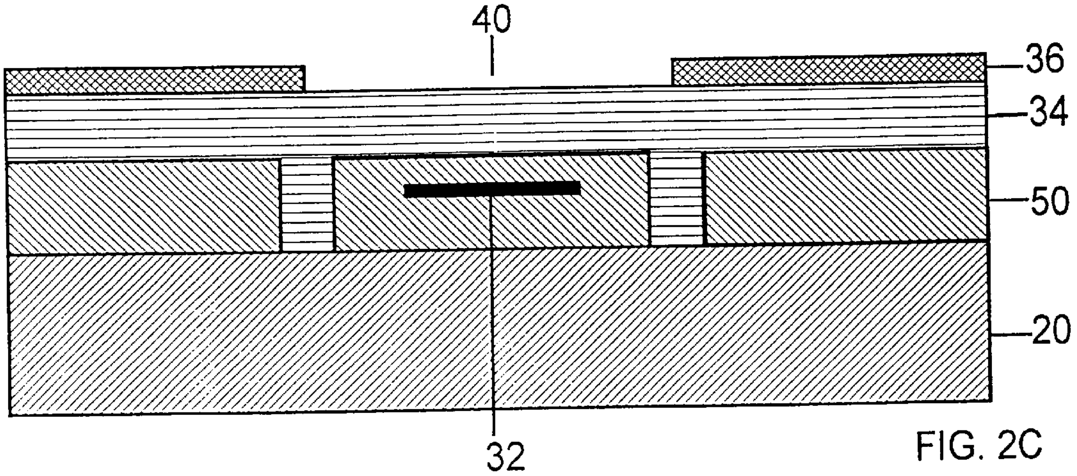

FIG. 2C shows the deposition and removal of photoimagable material 36 to form an opening to expose the graded dielectric material 34 where an orifice is to be etched. Photoimagable material 36 is any appropriate soft or hard mask such as photoresist, epoxy polyamide, acrylate, photoimagable polyamide, or other appropriate photoimagable material.

Figure 2D:
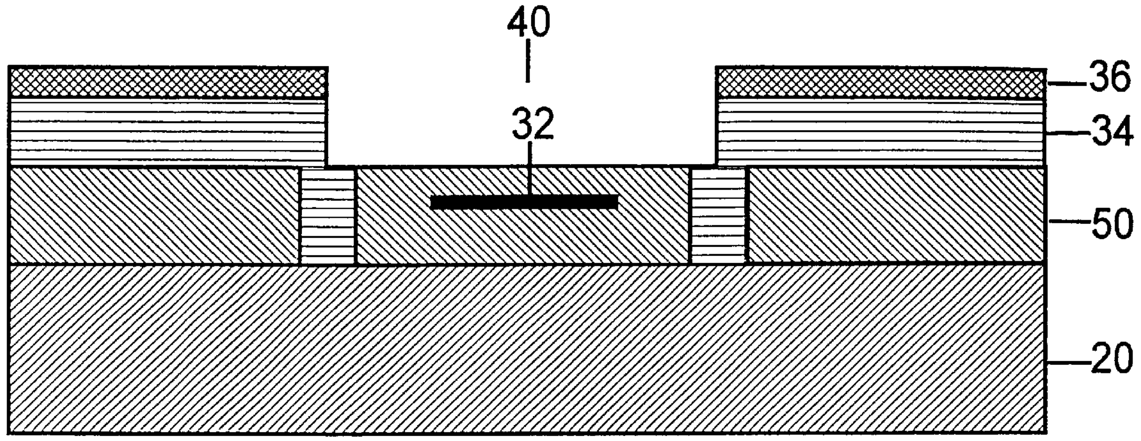

FIG. 2D shows the result of an anisotropic dry etch of the graded dielectric material 34 to produce a straight walled orifice 40. The anisotropic dry etch is performed utilizing an RIE mode fluorine-based chemistry or similar process to produce a near erect wall or slightly positive profile via type structure.

Figure 2E:
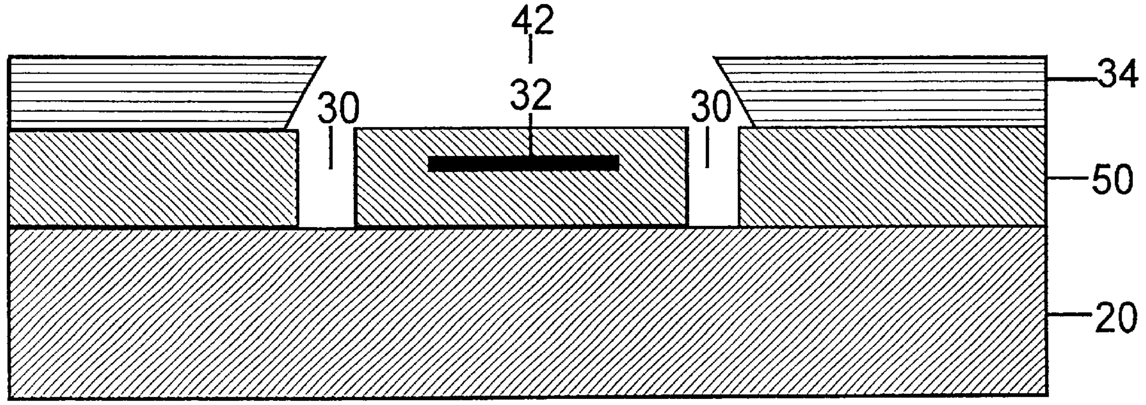

FIG. 2E shows the result of an isotropically dry or wet etch via to produce the reentrant orifice bore profile 42. This step is performed, in the preferred embodiment, using an isotropic dry etch tool using a fluorinated and/or chlorinated-based plasma chemistry, or alternatively, in a BOE (buffered oxide etch) process chemistry, or a hot phosphoric process chemistry typically operating at a temperature between 120 to 180 degree C. When the graded dielectric material 34 is done by composition, a wet etch range up to and greater than 1000–3000 Ang/min. can be achieved. The method of isotropically etching is chosen to produce a reentrant orifice profile given the method in which the deposited dielectric material was gradated.

Figure 2F:
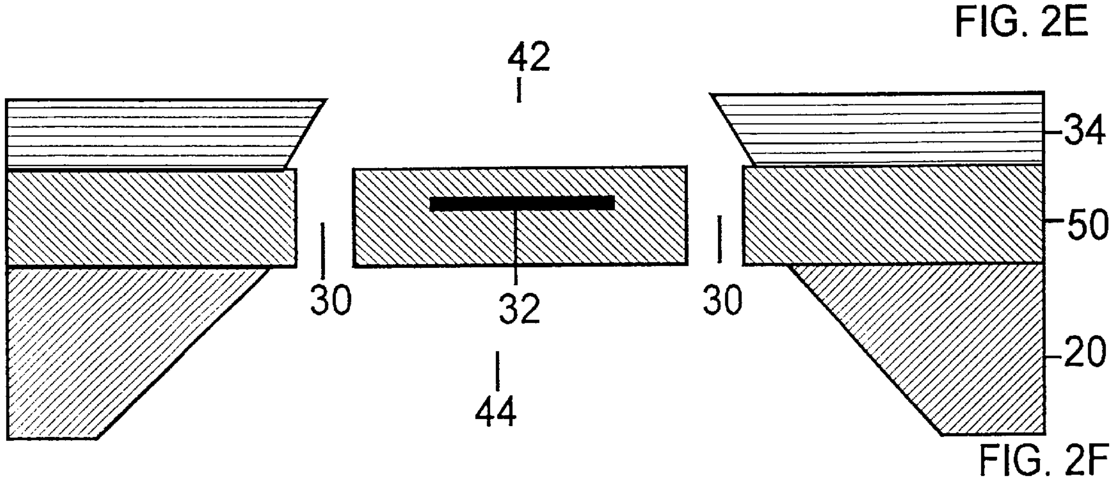

FIG. 2F shows the result of an anisotropic etch for forming the fluid feed channel 44 on the semiconductor substrate 20 backside. The silicon dioxide etch rates in a TMAH (tetramethyl ammonium hydroxide) solution are negligible and thus limit the etching process from attacking the thin film materials.

Figure 3A:
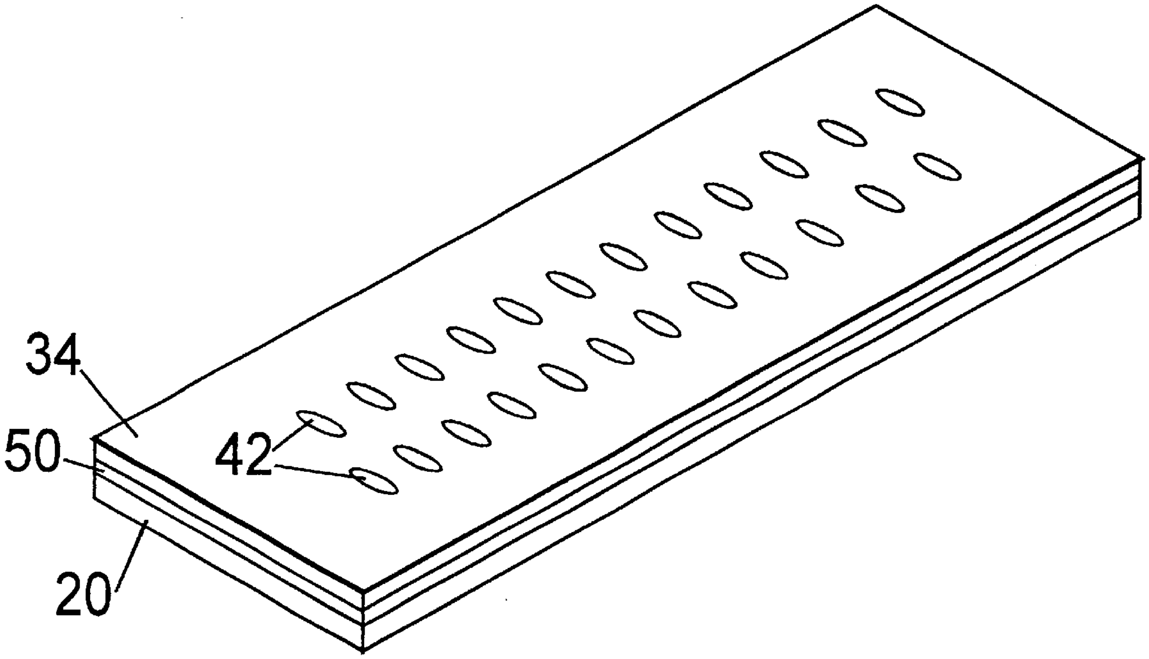
FIG. 3A is the top view of a printhead showing multiple orifices.
Figure 3B:
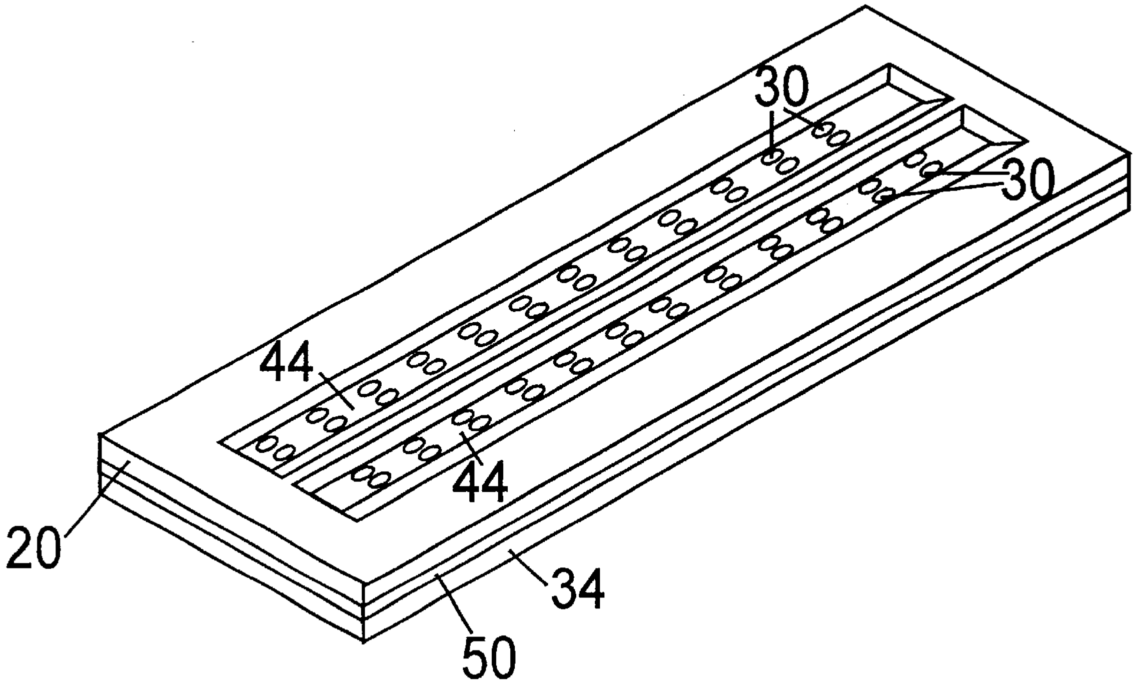
FIG. 3B is the bottom view of the printhead shown in FIG. 3A.

FIG. 3A shows a multiple orifice printhead, employing the present invention and showing the location of reentrant orifices 42, graded dielectric material 34, stack of thin film layers 50 and semiconductor substrate 20. FIG. 3B shows the backside of the multiple orifice printhead shown in FIG. 3A. The backside reveals the fluid feed channels 44 and fluid feed slots 30 as well as the aforementioned graded dielectric material 34, thin film layers 50 and semiconductor substrate 20.

Figure 4:
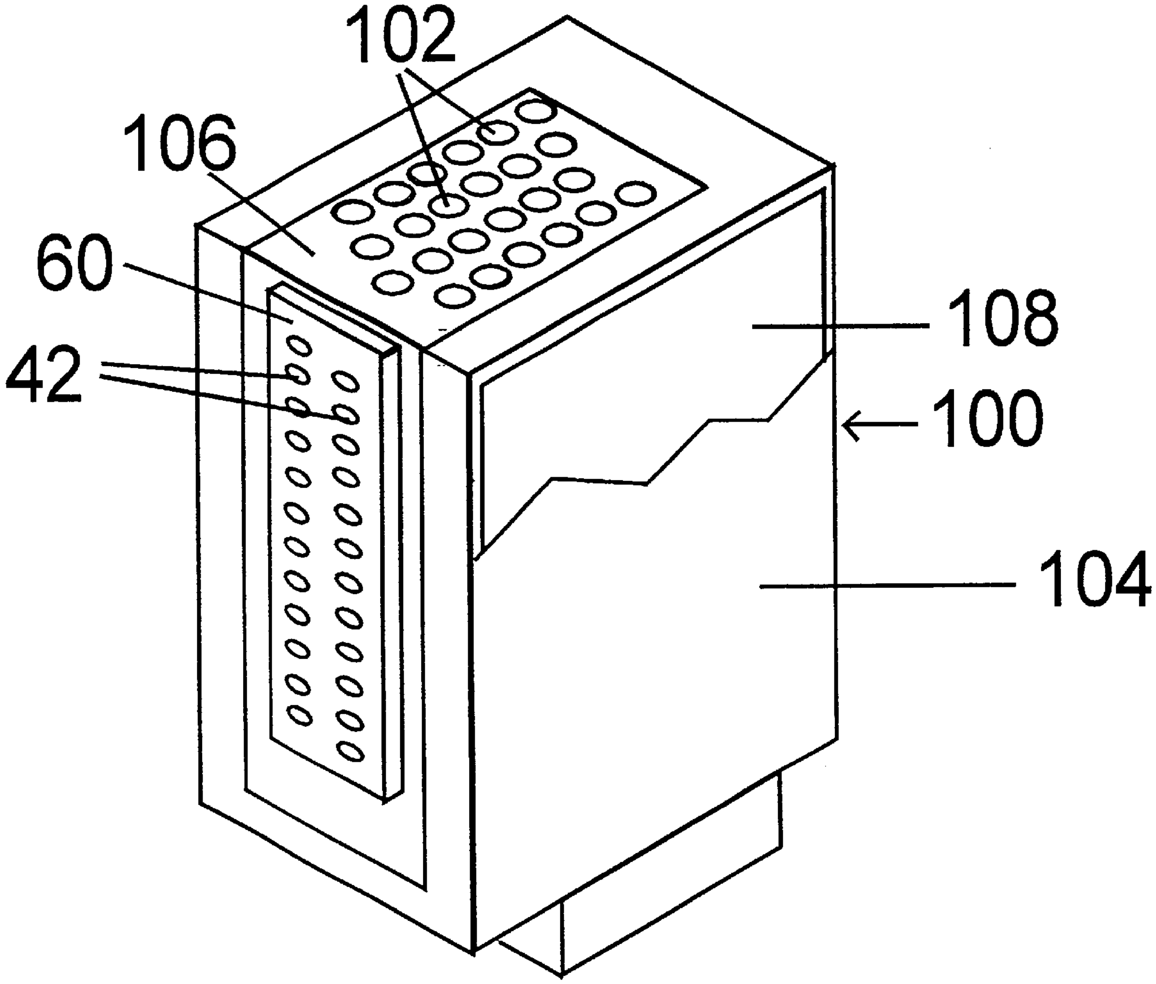
FIG. 4 shows a print cartridge that utilizes a printhead which may employ the present invention.

FIG. 4 shows an assembled fluid print cartridge which contains the printhead 60 having multiple reentrant orifices 42, a fluid delivery system 100, a fluid reservoir 104, electrical contacts 102 for controlling the printhead 60 and a flex circuit 106 to connect the electrical contacts 102 to the printhead 60.

Figure 5:
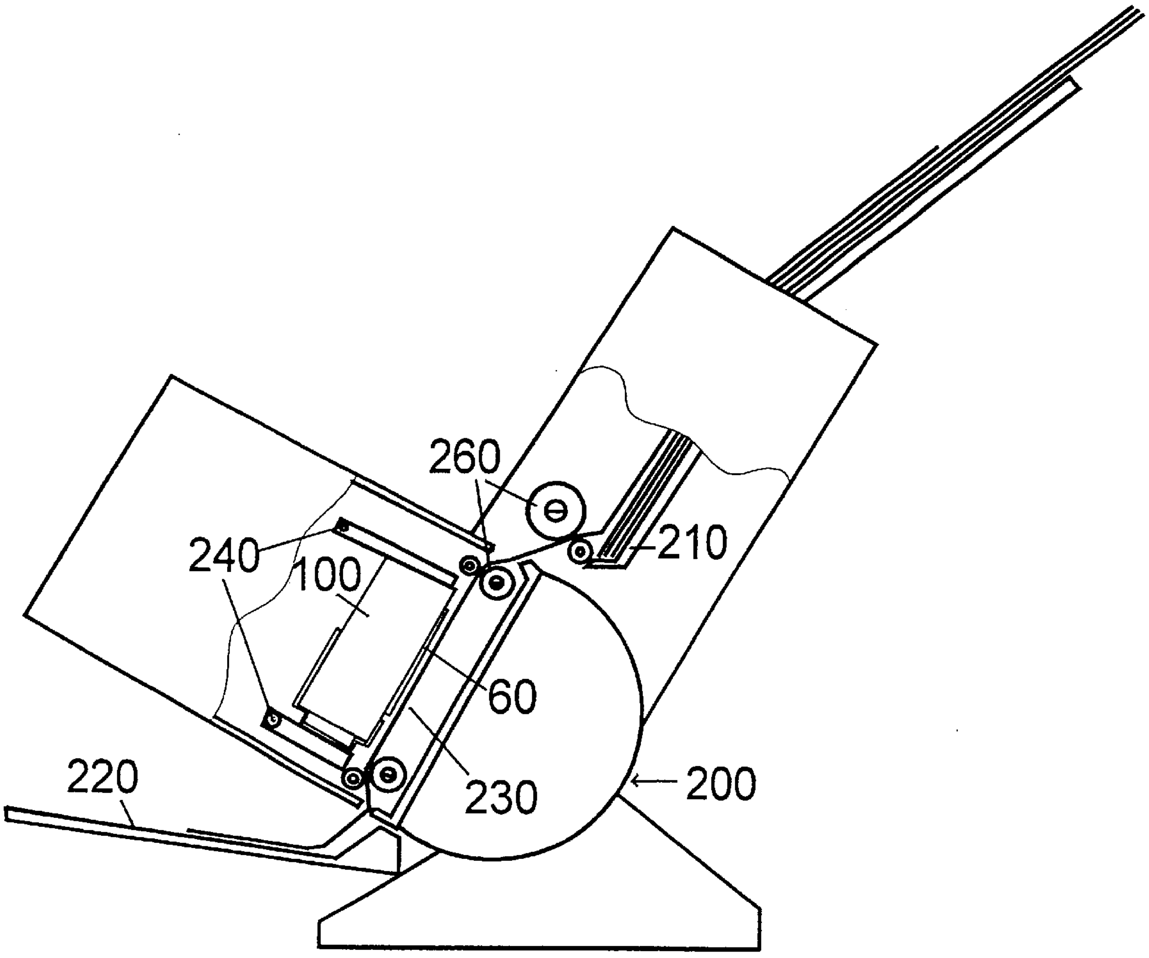
FIG. 5 shows a printer mechanism using a print cartridge that has a printhead which may employ the present invention.

FIG. 5 shows a printer assemblage 200 that uses the fluid print cartridge from FIG. 4. The cartridge is mounted on carriage assemblage 240. Recording medium 230 is fed through the printer using a feed mechanism 260 and receiving tray 210. The recording medium 230 is printed upon as it passes printhead 60 and is ejected into output tray 220.

Figure 6A:
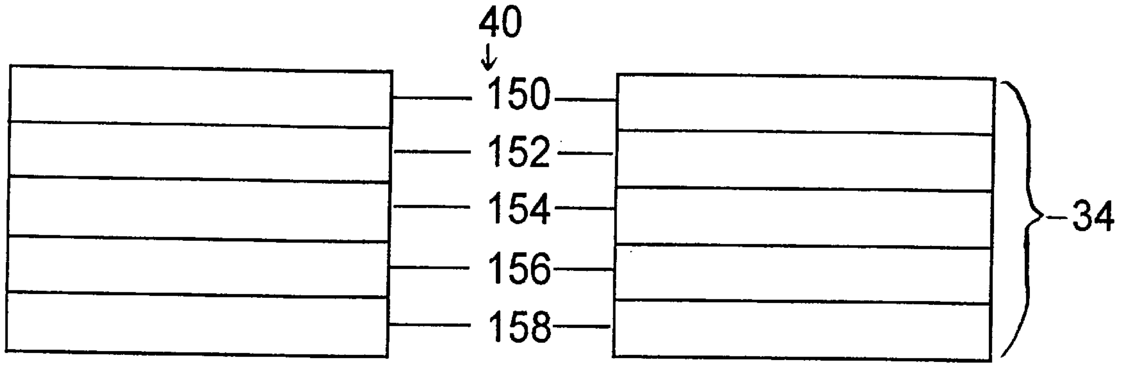
FIG. 6A shows a cross section of the dielectric layer created using an iteration of multiple thin layers from which an orifice is formed.
Figure 6B:
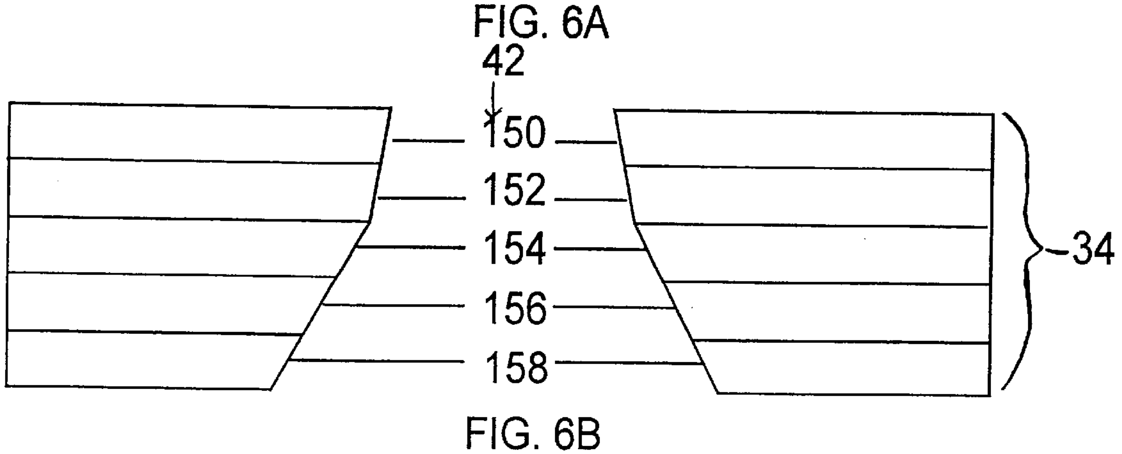
FIG. 6B shows a cross section of the combined dielectric layers after an isotropic etch to form a reentrant bore profile.

FIG. 6A shows the dielectric layer created using an iteration of multiple thin layers 150, 152, 154,156 and 158, with the most tensile layer 158 near the semiconductor substrate. The inner layers 156, 154, and 152, respectively, each have more compression than the previous layer deposited. The least tensile or most compressed layer 150 is deposited last. For a 10 micron constructed orifice, each layer comprises 2 microns of material. An alternative embodiment is to have each thin layer be a different height than other thin layers to allow for a desired profile shape after etching. Straight wall orifice 40 is formed after the material is anisotropically etched. FIG. 6B shows the dielectric layer after an isotropic etch to form a reentrant bore profile. A reentrant orifice 42 is formed after isotropically etching graded dielectric layer 34.

Figure 6C:
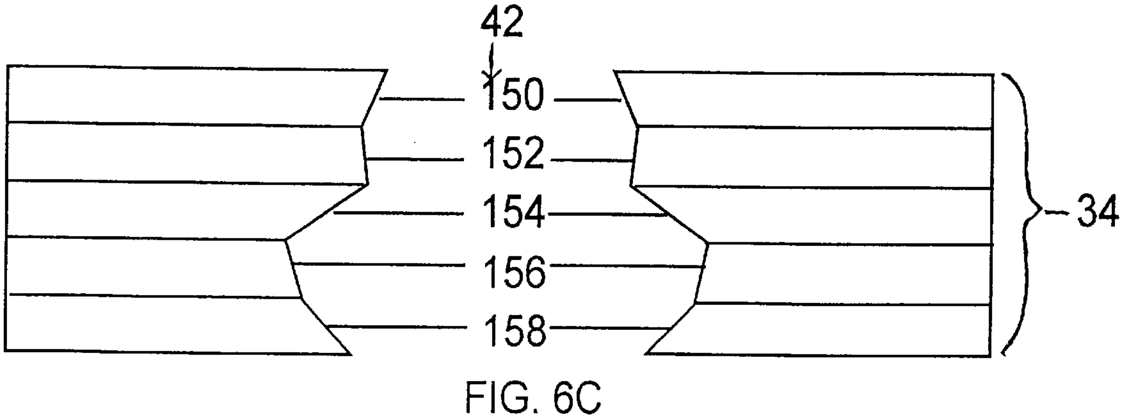
FIG. 6C shows a cross section of an orifice having serrated edges created using the present invention.

FIG. 6C shows a unique serrated orifice that can be produced by combining stress and composition gradients. In this case, each thinner layer will etch at a rate proportional to its composition. The difference in stresses at the boundary between layers causes the etch rate of each thinner layer wall to be non-uniform and thus creates the serrated effect. By adjusting the composition and stress gradient of each thin layer, creative bore profiles can be designed.

Figure 7A:
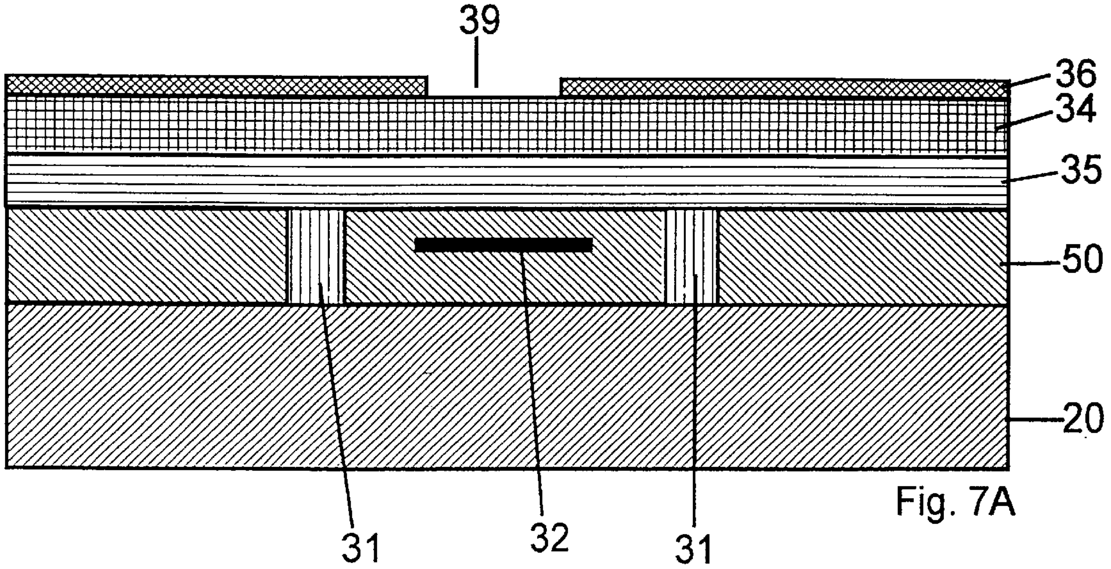
FIGS. 7A, 7B and 7D shows cross sections of the preferred embodiment at different stages.
Figure 7B:
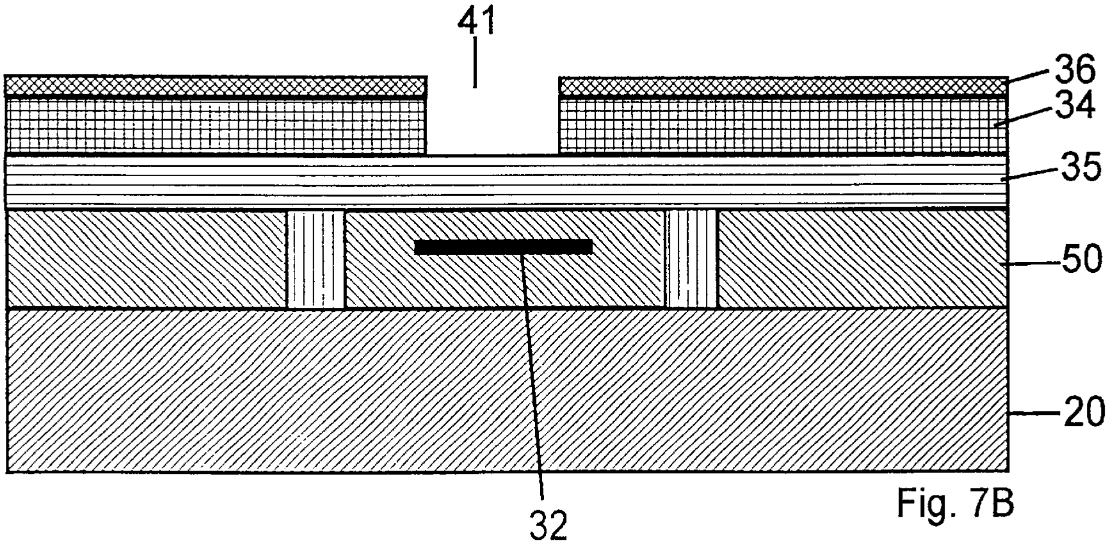
Figure 7C:
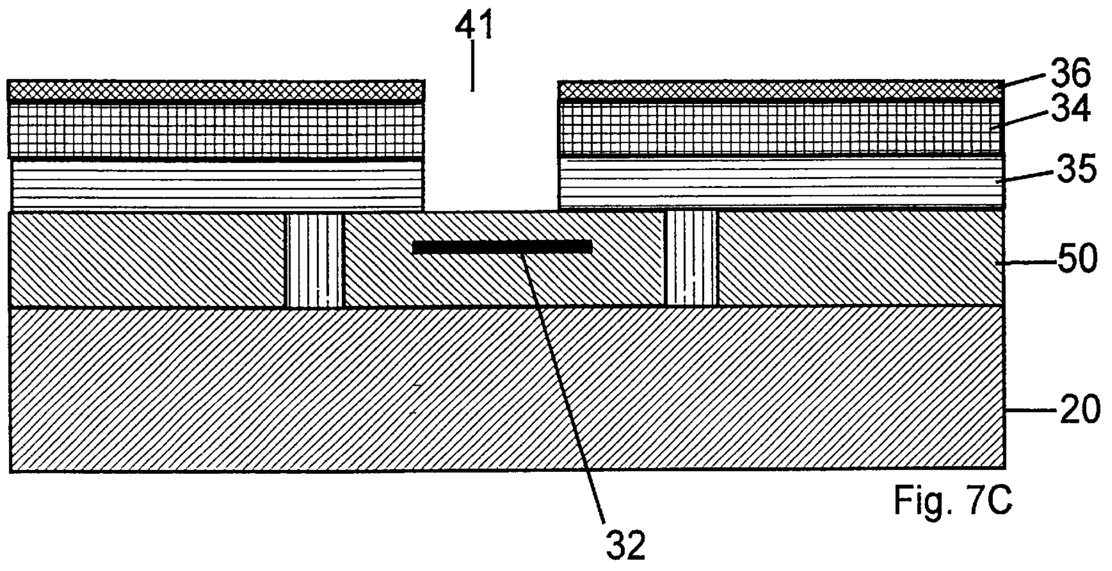
FIG. 7C shows a cross section of an alternative embodiment in which the anisotropically etched step shown in FIG. 7B etches both deposited dielectric layers.
Figure 7D:
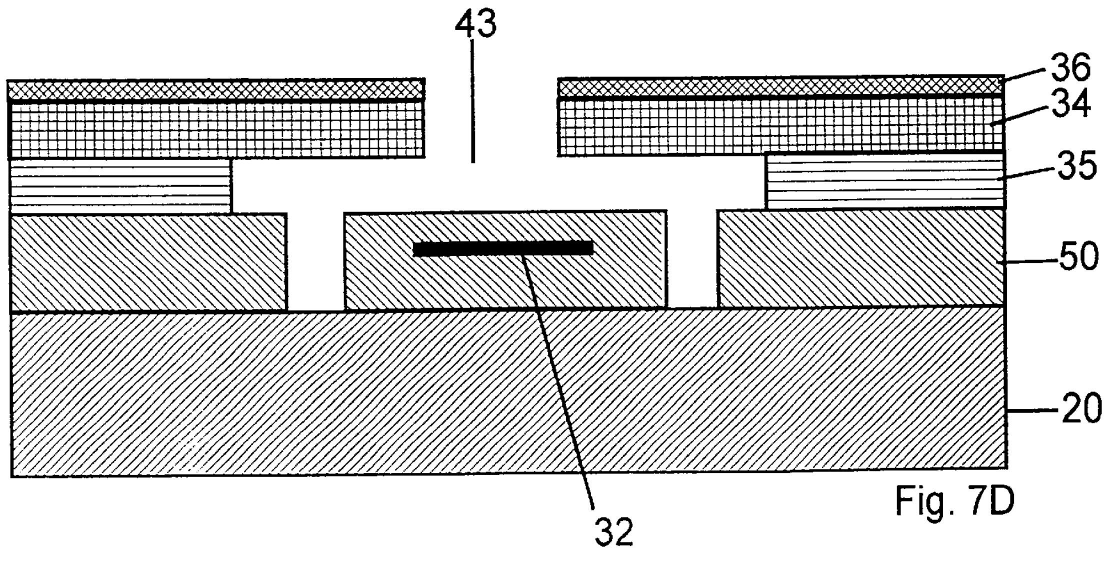

FIGS. 7A, 7B and 7D show the preferred embodiment of a printhead produced by the preferred process to create a unique orifice profile created by using the anisotropic etch technique. In FIG. 7A, two dielectric material layers are deposited on the semiconductor substrate 20 with thin film layers 50 and fluid feed slot filler 31. Fluid feed slot filler 31 can be either a physically deposited carbon or spin on carbon-based polymer. The first dielectric material 35 (preferably 5 microns of $SiO_2$) is picked to be very reactive to an isotropic etch process chosen (preferably a wet etch in BOE). The second dielectric material 34 (preferably 5 microns of SiN), deposited after first dielectric material layer 35, is picked to be minimally reactive to the isotropic etch process and to be reactive to the chosen anisotropic etch process that is used to form near erect walls 41 in second dielectric layer 34. Photoresist layer 36 is used to form pattern 39 of the orifice opening. In FIG. 7B, the anisotropic etch is then performed to form the near erect walls 41 in the second layer. The anisotropic etch technique used is reactive only to the second dielectric layer 34 and not the first dielectric layer 35. In an alternate embodiment to that in FIG. 7B, FIG. 7C shows a process step where the anisotropic etch process etches both the second dielectric material layer 34 and first dielectric material layer 35. Finally, after the steps in either FIG. 7B or FIG. 7C, in FIG. 7D, an isotropic etch is then performed to form cavity 43 in first dielectric layer 35. The isotropic etch chosen has little or no reaction to second dielectric layer 34 but is highly reactive to first dielectric layer 35. The fluid feed slot filler is then etched using either a solvent or dry ash to open the fluid feed slots.

While many different reentrant orifice shapes have been shown, other reentrant shapes are possible using the aforementioned techniques and fall within the spirit and scope of the invention.

The invention addresses the need of tighter fluid jet directional control and smaller drop volume for finer resolution required for vibrant clear photographic printing. In addition, the invention simplifies manufacturing of the printhead, which lowers the cost of production, enables high volume run rates and increases the quality, reliability and consistency of the printheads. The invention uses existing semiconductor processing equipment and materials to create a precise reentrant shaped orifice from any of a number of graded dielectric materials utilizing isotropic and anisotropic etching processes. The preferred embodiment, and its alternative embodiments of the invention, demonstrate that unique orifice shapes can be created to address additional concerns or to take advantage of different properties of the fluid expelled from the printhead.

What is claimed is:

1. A method for creating reentrant holes through a layer of dielectric material on a semiconductor substrate having a first surface, comprising the steps of:

depositing the layer of graded dielectric material on the first surface of the semiconductor substrate;

applying a masked photoimagable material on said deposited layer of graded dielectric material;

exposing said masked photoimagable material to electromagnetic energy, whereby patterned photoimagable material is created;

developing said patterned photoimagable material;

anisotropically etching said deposited layer of graded dielectric material; and isotropically etching said deposited layer of graded dielectric material thereby creating the reentrant holes directed inwards from the first surface.

2. A semiconductor substrate produced in accordance with the method of claim 1.

3. A semiconductor substrate having a first surface, comprising a layer of graded dielectric material having a degree of gradation deposited on the first surface of the semiconductor substrate and defining a plurality of holes extending through said layer of graded dielectric material, at least one of the holes has a reentrant profile directed inwards from the first surface related to said degree of gradation of said graded dielectric material.

4. The semiconductor substrate in accordance with claim 3, wherein said layer of graded dielectric material further comprises a thickness of 8 to 30 microns.

5. The semiconductor substrate in accordance with claim 3, wherein said layer of graded dielectric material is essentially silicon dioxide.

6. The semiconductor substrate in accordance with claim 3, wherein said layer of graded dielectric material is essentially silicon oxynitride.

7. The semiconductor substrate in accordance with claim 3, wherein said layer of graded dielectric material further comprises a layer of essentially silicon dioxide and a layer of essentially silicon oxynitride.

8. A head for ejecting fluid using a semiconductor substrate, comprising:

a semiconductor substrate having a first surface and a second surface;

a stack of thin film layers affixed to said first surface of said semiconductor substrate;

a plurality of fluid feed slots established through said stack of thin film layers;

a layer of graded dielectric material having a plurality of orifices defined therein, said graded dielectric material deposited on said stack of thin film layers, each orifice of said plurality of orifices disposed to a respective fluid feed slot of said plurality of fluid feed slots, at least one orifice of said plurality of orifices having a reentrant profile directed inwards from said first surface;

a plurality of energy dissipating elements to propel fluid from associated orifices of said plurality of orifices; and a plurality of fluid feed channels defined within said second surface of said semiconductor substrate and opening into said plurality fluid feed slots.

9. A fluid cartridge used to deliver fluid comprising the head for ejecting fluid as in claim 8, further comprising:

a fluid reservoir; and a fluid delivery assemblage for delivering fluid from the fluid reservoir to said plurality of fluid feed channels.

10. A liquid fluid jet recording apparatus comprising a fluid cartridge according to claim 9 and further comprising a conveyance assemblage for transporting a recording medium on which recording is effected by said fluid cartridge.

* * * * *